US009953863B1

(12) United States Patent
Ho et al.

(10) Patent No.: US 9,953,863 B1
(45) Date of Patent: Apr. 24, 2018

(54) METHODS OF FORMING AN INTERCONNECT STRUCTURE

(71) Applicant: Taiwan Semiconductor Manufacturing Company, Ltd., Hsin-Chu (TW)

(72) Inventors: Chun-Te Ho, Hsin-Chu (TW); Chien-Chih Chiu, Xinying (TW); Ming-Chung Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/288,293

(22) Filed: Oct. 7, 2016

(51) Int. Cl.
    *H01L 21/4763* (2006.01)
    *H01L 21/768* (2006.01)

(52) U.S. Cl.
    CPC .. *H01L 21/76813* (2013.01); *H01L 21/76819* (2013.01); *H01L 21/76826* (2013.01); *H01L 21/76843* (2013.01); *H01L 21/76877* (2013.01)

(58) Field of Classification Search
    CPC ........... H01L 23/5226; H01L 21/02697; H01L 21/76813
    See application file for complete search history.

(56) References Cited

U.S. PATENT DOCUMENTS

| | | | |
|---|---|---|---|
| 6,127,276 A * | 10/2000 | Lin ................... | H01L 21/76802 257/E21.577 |
| 7,838,424 B2 | 11/2010 | Karta et al. | |
| 7,863,742 B2 | 1/2011 | Yu et al. | |
| 7,932,601 B2 | 4/2011 | Chang et al. | |
| 8,754,508 B2 | 6/2014 | Chen et al. | |
| 8,772,151 B2 | 7/2014 | Chen | |
| 8,846,548 B2 | 9/2014 | Tu et al. | |
| 2009/0280633 A1* | 11/2009 | Wei ................... | H01L 21/76897 438/597 |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0183693 A1 | 7/2014 | Tsai et al. | |
| 2014/0187103 A1 | 7/2014 | Chen et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0262468 A1 | 9/2014 | Chen et al. | |
| 2014/0264885 A1 | 9/2014 | Tsai et al. | |
| 2015/0162240 A1* | 6/2015 | Chiu ................ | H01L 21/76877 438/653 |
| 2016/0005792 A1* | 1/2016 | Ueki ................ | H01L 45/08 257/4 |

* cited by examiner

*Primary Examiner* — Selim Ahmed
*Assistant Examiner* — Evan Clinton
(74) *Attorney, Agent, or Firm* — Slater Matsil, LLP

(57) ABSTRACT

A method of forming an interconnect structure is provided. The method includes forming a first dielectric layer, and forming an opening in the first dielectric layer. The method also includes applying a gas to the first dielectric layer adjacent to the opening, where after applying the gas to the first dielectric layer adjacent to the opening, a bottom surface of the opening has been planarized. The method also includes etching the first dielectric layer through the opening to expose a first contact underlying the first dielectric layer, and forming a conductive line in the opening.

20 Claims, 12 Drawing Sheets

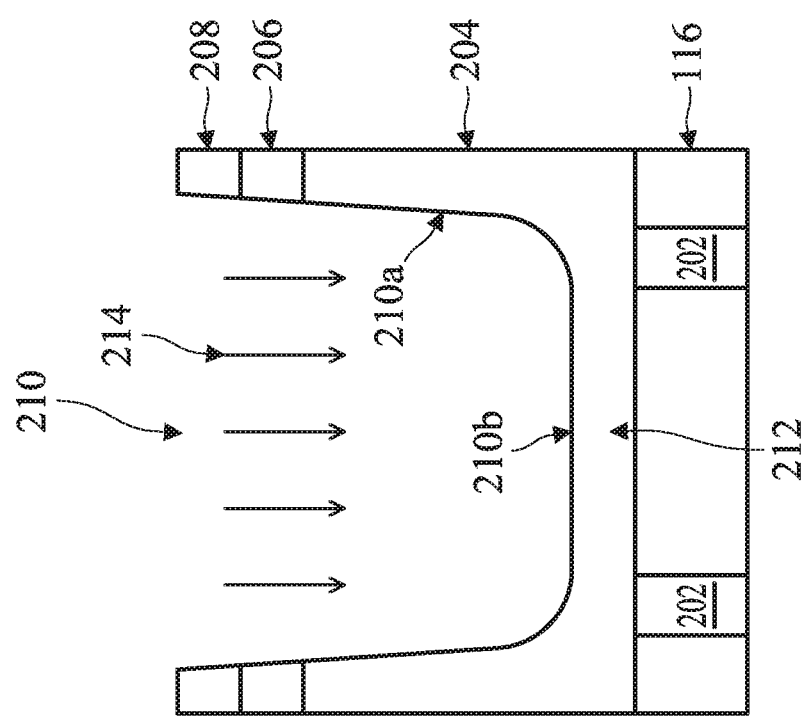

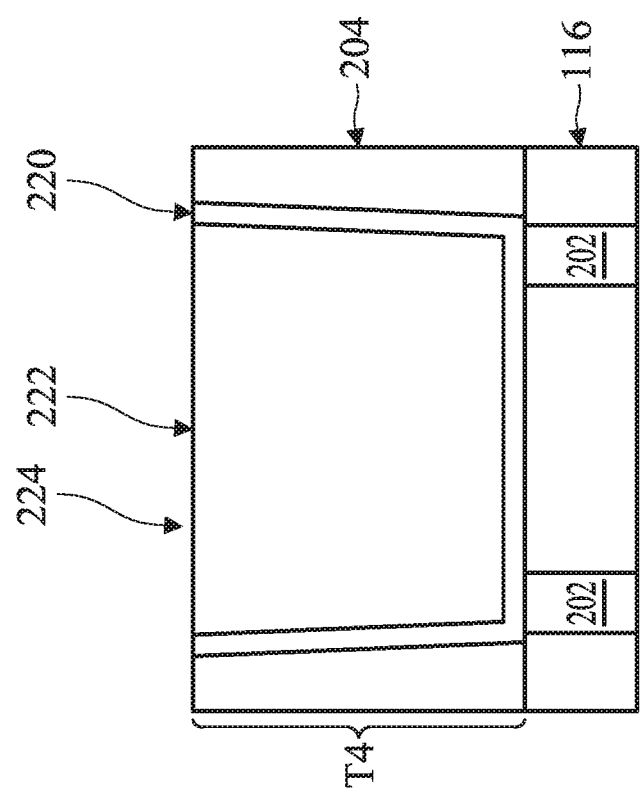

METHODS OF FORMING AN INTERCONNECT STRUCTURE

BACKGROUND

In the current process of miniaturizing semiconductor devices, low-k dielectric materials are desired as the inter-metal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC).

However, the materials that are currently being considered or used as low-k dielectric materials are not ideal. In particular, in choosing a material based upon its k-value, and particularly based upon its low-k value, other characteristics, such as the hardness of the material or its strength, may not be ideal for use in a semiconductor manufacturing process. As such, improvements in processes that utilize low-k dielectric materials are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5, 6, 7, 8A, 8B, and 9 through 12 are a cross-sectional views of intermediate stages in the manufacturing of an interconnect structure in accordance with some embodiments.

DETAILED DESCRIPTION

Figure 1:
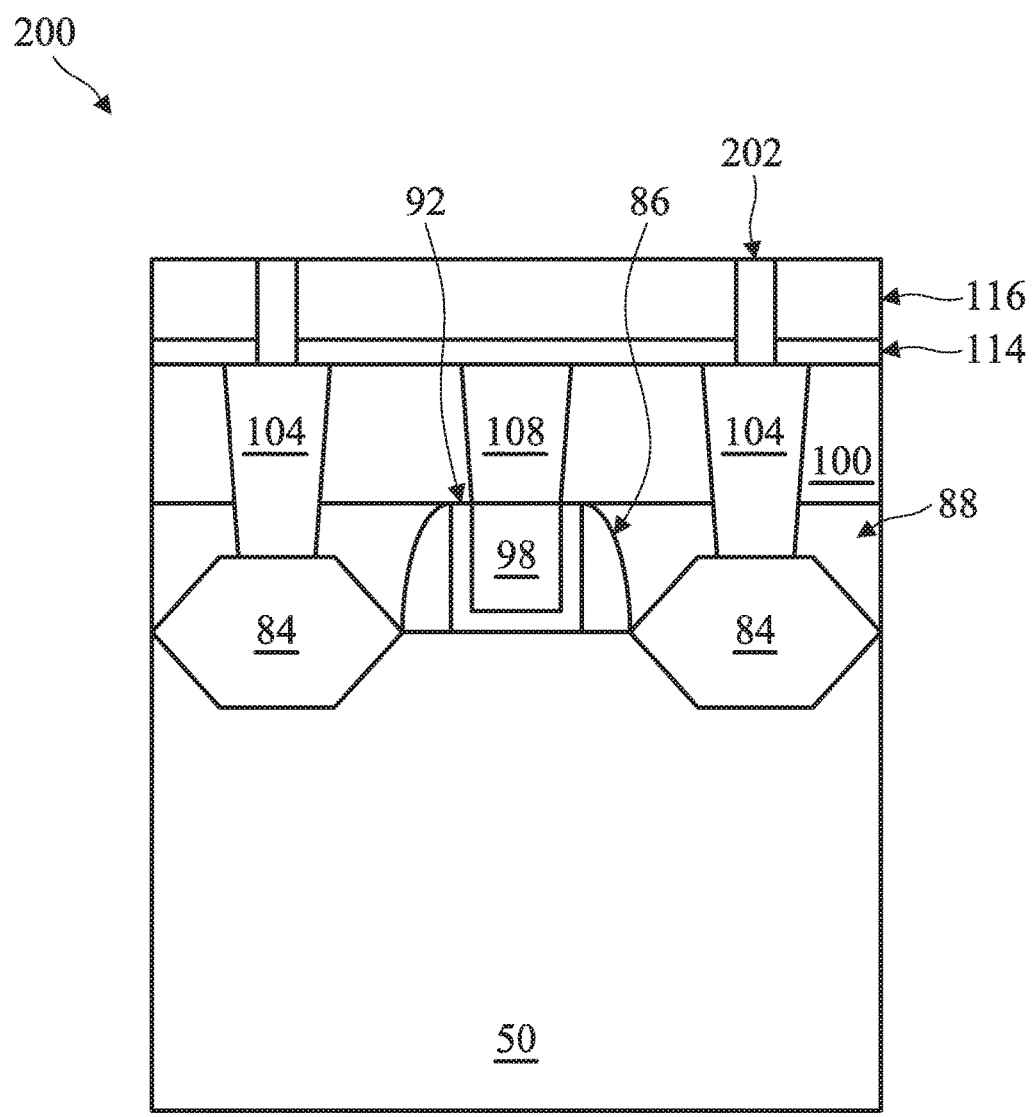
FIGS. 1 through 4 are cross-sectional views of intermediate stages in the manufacturing of a transistor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures and methods of forming the same are provided in accordance with various embodiments. Intermediate stages of forming interconnect structures are illustrated. Some embodiments discussed herein are discussed in the context of interconnects formed using a single damascene process. In other embodiments, a dual damascene process may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

With reference now to FIG. 1, a cross-sectional view of an intermediate stage in the manufacturing of a transistor structure 200 in accordance with exemplary embodiments is depicted. Transistor structure 200 may include any suitable kind of transistor. For example, transistor structure 200 may be a planar transistor, a Fin Field Effect Transistor (finFET), or a gate all around transistor.

In some embodiments, transistor structure 200 includes substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. Substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Epitaxial source/drain regions 84 may be formed in substrate 50. In some embodiments, source/drain regions are etched in substrate 50 to form recesses. Epitaxial source/drain regions 84 are epitaxially grown in the recesses. Epitaxial source/drain regions 84 may include any acceptable material, and the material may depend upon whether transistor structure 200 is n-type or p-type. For example, for an n-type transistor, if substrate 50 is silicon, the epitaxial source/drain regions 84 may include silicon, SiC, SiCP, SiP, or the like. The epitaxial source/drain regions 84 may have surfaces raised from respective surfaces of substrate 50 and may have facets. For a p-type transistor, if substrate 50 is silicon, then epitaxial source/drain regions 84 may comprise SiGe, SiGeB, Ge, GeSn, or the like.

Gate spacers 86 are formed on substrate 50 between epitaxial source/drain regions 84. Gate spacers 86 may be formed by conformally depositing a material and subsequently anisotropically etching the material. The material of gate spacers 86 may be silicon nitride, SiCN, silicon oxide, silicon oxynitride, a combination thereof, or the like.

Gate dielectric layer 92 is formed in a recess between gate spacers 86. Although FIG. 1 depicts a single gate dielectric layer 92, in some embodiments more than one gate dielectric layer may be present. In accordance with some embodiments, gate dielectric layer 92 comprises silicon oxide, silicon nitride, or multilayers thereof. In other embodiments, gate dielectric layer includes a high-k dielectric material, and in these embodiments, gate dielectric layer 92 may have a k value greater than about 7.0, and may include a metal oxide or a silicate of Hf, Al, Zr, La, Mg, Ba, Ti, Pb, and combinations thereof. The formation method of gate dielectric layer 92 may include Molecular-Beam Deposition (MBD), Atomic Layer Deposition (ALD), plasma-enhanced chemical vapor deposition (PECVD), and the like.

Gate electrode 98 fills the remaining portions of the recess. Gate electrode 98 may be made of a metal-containing material such as TiN, TaN, TaC, Co, Ru, Al, combinations thereof, or multi-layers thereof.

Interlayer dielectric layer (ILD) 88 is formed over a surface that includes epitaxial source/drain regions 84, Gate spacers 86, gate dielectric layer 92, and gate electrode 98. In some embodiments, the ILD 88 is a flowable film formed by a flowable CVD method. In some embodiments, ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), spin on glass (SOG), or the like, and may be formed by any suitable method, such as chemical vapor dposition (CVD), or PECVD. ILD 88 may have a top surface that is planar with a top surface of gate spacers 86 and gate electrode 98.

ILD 100 is formed over ILD 88, and contacts 104 are formed through ILD 100 and ILD 88. Contact 108 is formed through ILD 100. In some embodiments, ILD 100 is a flowable film formed by a flowable CVD method. In some embodiments, ILD 100 is formed of a dielectric material such as PSG, BSG, BPSG, USG, or the like, and may be formed by any suitable method, such as CVD and PECVD. Contacts 104 are physically and electrically coupled to epitaxial source/drain regions 84. Contact 108 is physically and electrically coupled to gate electrode 98.

An etch stop layer 114 may be formed over ILD 100. In some embodiments, etch stop layer 114 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof.

In some embodiments, an interconnect structure is formed overlying contacts 108 and 104. The interconnect structure may include electrical connectors that electrically couple contact 108 and contacts 106 to other devices or components within a same package or that electrically couple contact 108 and contacts 106 to external devices or components. The interconnect structure may contain one or more dielectric layer(s), and electrical routing lines may be formed in the dielectric layer(s). The electrical routing lines may include conductive lines that extend in a dielectric layer and conductive vias that connect conductive lines in one dielectric layer to conductive features below and/or overlying the dielectric layer. The dielectric layer(s) may be formed in order to help isolate the electrical routing lines in the dielectric layer(s) from other adjacent electrical routing lines. In some embodiments the dielectric layer(s) may be, e.g., a low-k dielectric film intended to help isolate the electrical routing lines from other structures. By isolating the electrical routing lines, the resistance-capacitance (RC) delay of the interconnect structure may be reduced, thereby improving the overall efficiency and speed of electricity through the interconnect structure.

FIGS. 1-12 depict intermediate stages in the formation of an interconnect structure over transistor structure 200. Referring to FIG. 1, first dielectric layer 116 is formed over etch stop layer 114. In some embodiments dielectric layer 116 may be, e.g., a low-k dielectric film. In some embodiments the first dielectric layer 116 may be a porous material such as SiOCN, SiCN, SiOC, SiOCH, or the like and may be formed by initially forming a precursor layer over the etch stop layer 114, if present. The precursor layer may comprise both a matrix material and a porogen interspersed within the matrix material, or may alternatively comprise the matrix material without the porogen. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the etch stop layer 114, may also be utilized.

The precursor layer may be formed to a thickness sufficient to provide the isolation and routing characteristics that are desired of the first dielectric layer 116. In an embodiment, the precursor layer may be formed to a first thickness in a range from about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a chemical vapor deposition (CVD), physical vapor deposition (PVD), or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of first dielectric layer 116. The porogen may be a material that is big enough to form the pores while also remaining small enough such that the size of the individual pores does not overly displace the matrix material. As such, the porogen may comprise an organic molecule such as alpha-terpinene (ATRP) (1-Isopropyl-4-Methyl-1,3-Cyclohexadiene) or Cyclooctane (boat shape) or 1,2-bis(triethoxysilyl) ethane Silicon.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the first dielectric layer 16. For example, an anneal of in a range from about 200° C. and about 500° C., such as about 400° C., for in a range from about 10 seconds to about 600 seconds, such as about 200 seconds, may be utilized.

However, as one of ordinary skill in the art will recognize, the thermal process described above is not the only method that may be utilized to remove the porogen from the matrix material to form the first dielectric layer 16. Other suitable processes, such as irradiating the porogen with UV radiation to decompose the porogen, utilizing microwaves to decompose the porogen, a microwave annealing process, or a rapid thermal anneal process, may alternatively be utilized. These and any other suitable process to remove all or a portion of the porogen are all fully intended to be included within the scope of the embodiments.

Next, vias 202 are formed in dielectric layer 116. Vias 202 may physically and electrically couple contacts 104 to a conductive line that is formed overlying first dielectric layer 116 (see FIG. 12). Vias 202 may comprise copper, although other suitable materials such as aluminum, alloys, doped polysilicon, combinations thereof, and the like, may alternatively be utilized. Vias 202 may be formed by first creating openings in dielectric layer 116 that expose the underlying conductive features, and then depositing a seed layer, and then electroplating copper onto the seed layer, filling and overfilling the openings. A planarizing process may be performed to thin the electroplated copper material so that an upper surface of each via 202 is substantially planar with an upper surface of first dielectric layer 116.

Figure 2:
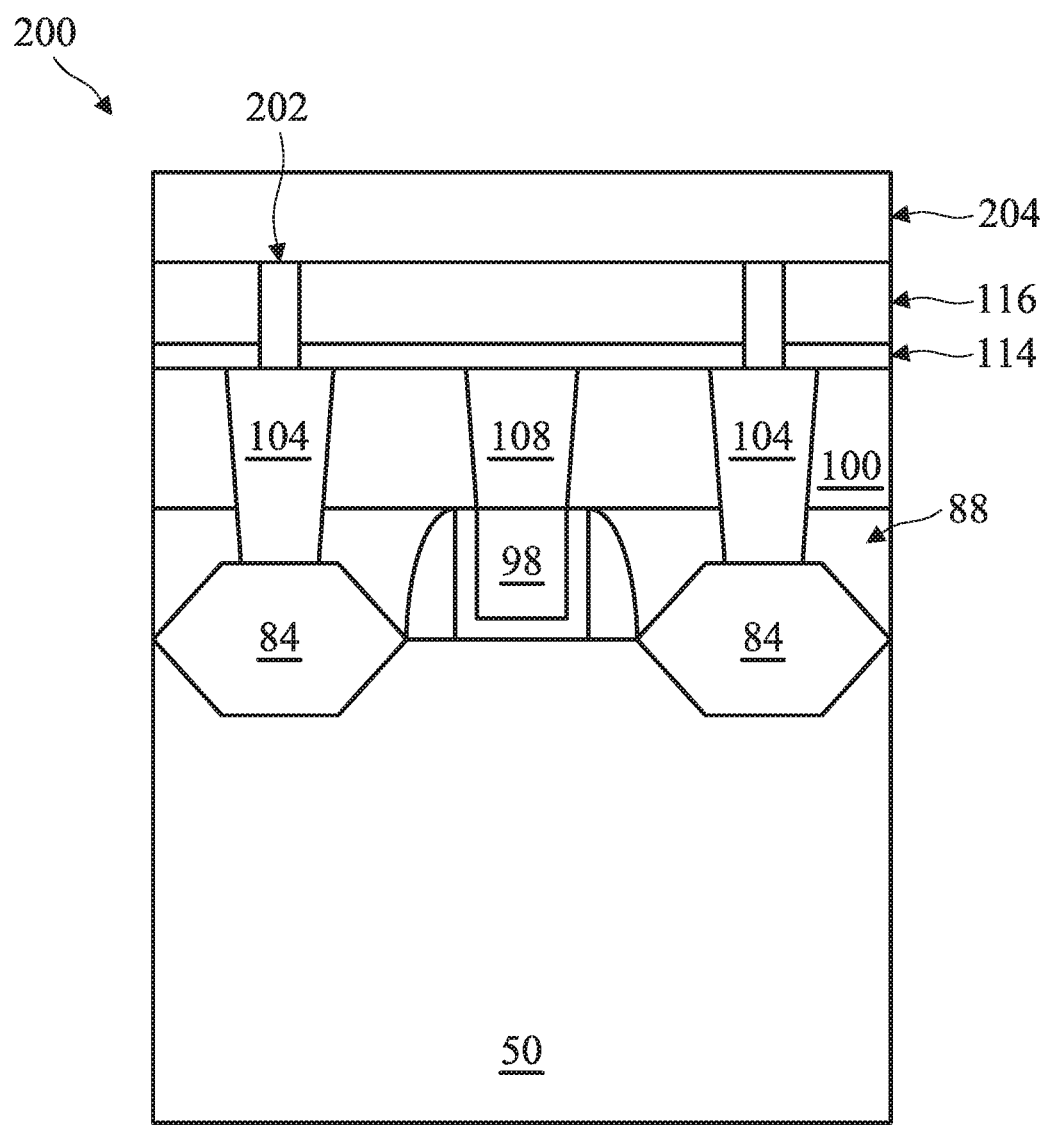

Referring to FIG. 2, second dielectric layer 204 is formed over dielectric layer 116. Second dielectric layer 204 may be formed using the same or similar processes and materials described above in connection with first dielectric layer 116, although this is not a requirement. In some embodiments, second dielectric layer may be a low k or an extra low-k dielectric material. For example, second dielectric layer 204 may comprise a material with a k value of less than about 3.9, such as less than about 2.0.

In some embodiments, as described in detail below in FIGS. 3-12, one or more conductive lines 224 will be formed in second dielectric layer 204. Conductive lines 224 may electrically couple contacts 104 and/or contact 108 to other devices and/or components within a same package. Conductive lines 224 may electrically couple contacts 104 and contact 108 to external electrical circuits. Second dielectric layer 204 may help to isolate conductive lines 224 in second dielectric layer 204 from each other.

Figure 3:
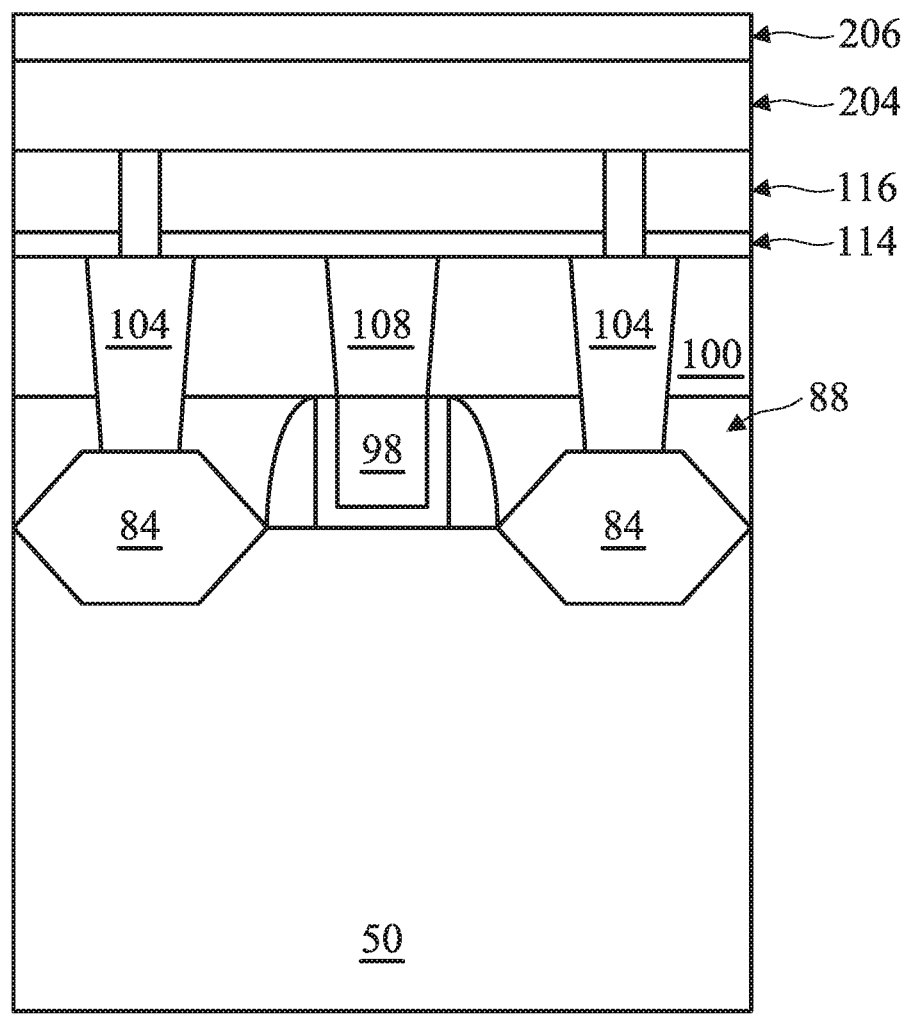

Referring to FIG. 3, pad layer 206 is formed over second dielectric layer 204. Pad layer 206 may be a thin film comprising silicon oxide formed, for example, using a thermal oxidation process. Pad layer 206 may act as an adhesion layer between second dielectric layer 204 and a mask layer 208 that will be formed over pad layer 206 (shown in FIG. 4). Pad layer 206 may also act as an etch stop layer for etching an overlying mask layer, such as mask layer 208.

Figure 4:
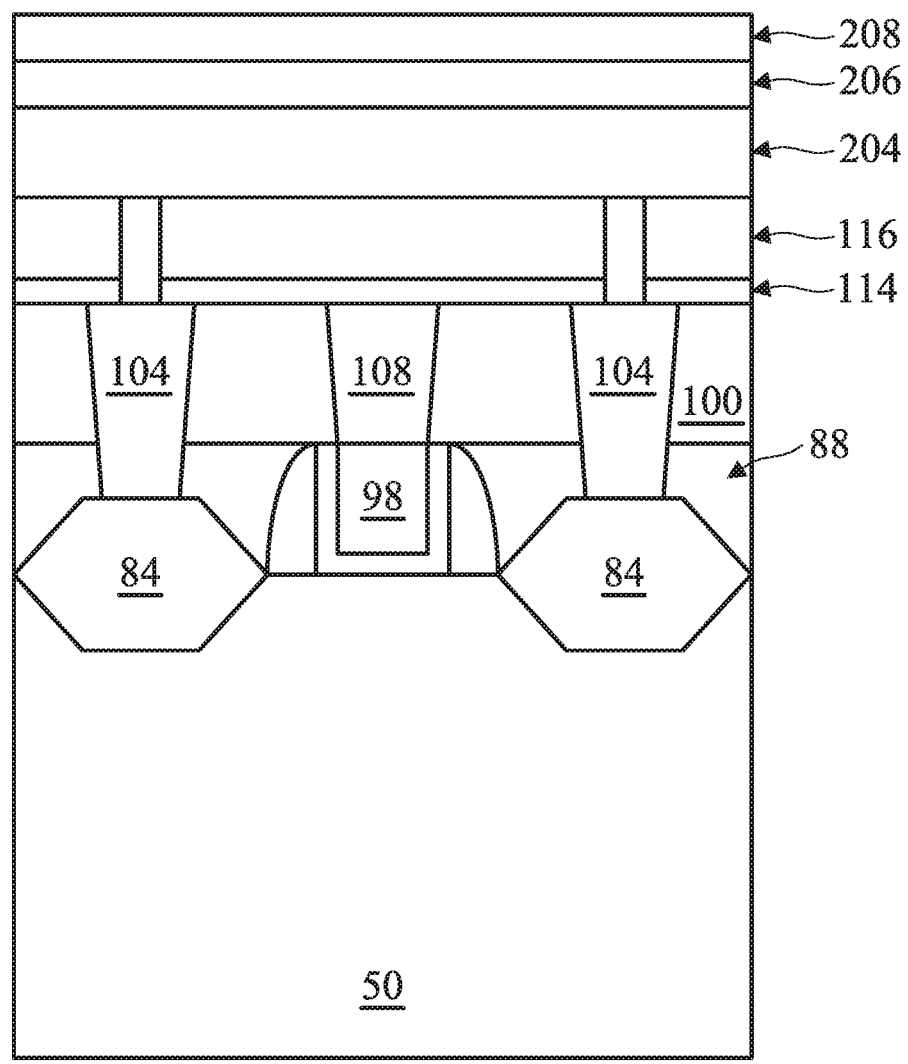

As shown in FIG. 4, mask layer 208 is formed over pad layer 206. In some embodiments, mask layer 208 may be a metal hard mask comprising, for example titanium nitride, titanium oxide, tantalum nitride, or the like. Other hard mask materials may also be used. Mask layer 208 may further include an anti-reflective coating layer (e.g., a nitrogen free anti-reflective coating (NFARC), not shown) to aid in the patterning of mask layer 208. In other embodiments, mask layer 208 is formed by plasma enhanced chemical vapor deposition (PECVD), or plasma anodic nitridation. Mask layer 208 is used as a hard mask during subsequent photolithography processes.

Figure 5:
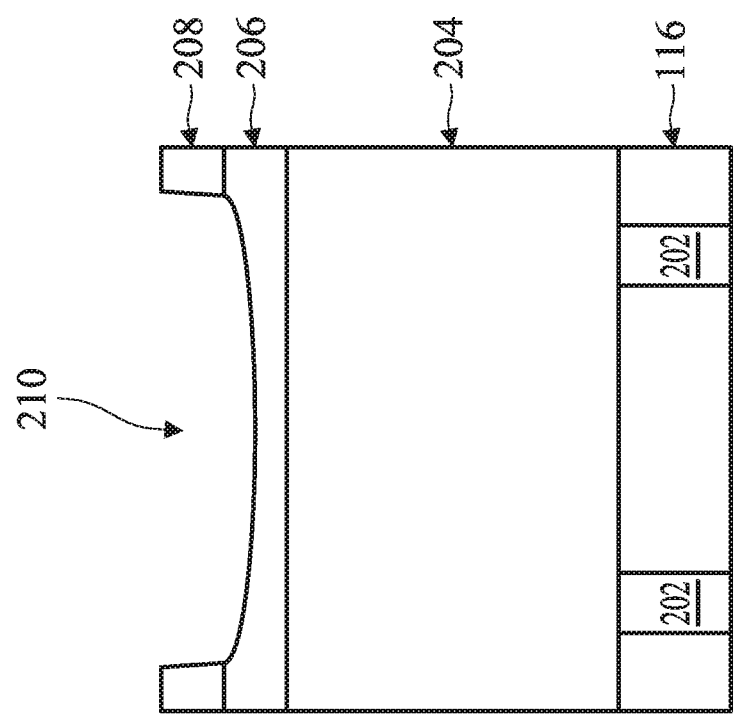

Referring to FIG. 5, a cross sectional diagram of an intermediate stage of forming a conductive line in second dielectric layer 204 is formed. FIG. 5 depicts a simplified diagram of the embodiment depicted in FIGS. 1-4. The discussion above regarding FIGS. 1-4 applies to the embodiments depicted in FIGS. 5 through 12, and vice versa.

FIG. 5 illustrates the patterning of mask layer 208 to form opening 210. Opening 210 may extend through mask layer 208 and partially into pad layer 206. In various embodiments, the patterning of mask layer 208 may be through a combination of photolithography and etching techniques. For example, a photoresist (not shown) may be disposed over mask layer 208. Portions of the photoresist may be exposed (e.g., using an ultraviolet light or an excise laser) through a patterning mask. The exposed or unexposed portion of photoresist may be then removed depending on whether a positive/negative resist was used, and mask layer 208 may be etched using the patterned photoresist as a mask. Subsequently, the photoresist may be removed (e.g., using an ashing technique). The etching of mask layer 208 may include a dry etching process using, for example, $C_xF_y$ (i.e., a fluorocarbon such as tetrafluoromethane, octafluoropropane, or the like), $N_2$, $O_2$, Ar, or the like as a process gas. Pad layer 206 may act as an etch stop layer during the patterning of mask layer 208.

FIG. 5 depicts an embodiment in which two vias 202 are disposed in first dielectric layer 116 underlying second dielectric layer 204. In some embodiments, one via 202 may be present, or more than two vias 202 may be present. Vias 202 are positioned at edges of opening 210 in FIG. 5, but some embodiments vias 202 may be positioned anywhere in opening 210 that conform to a desired design.

Figure 6:
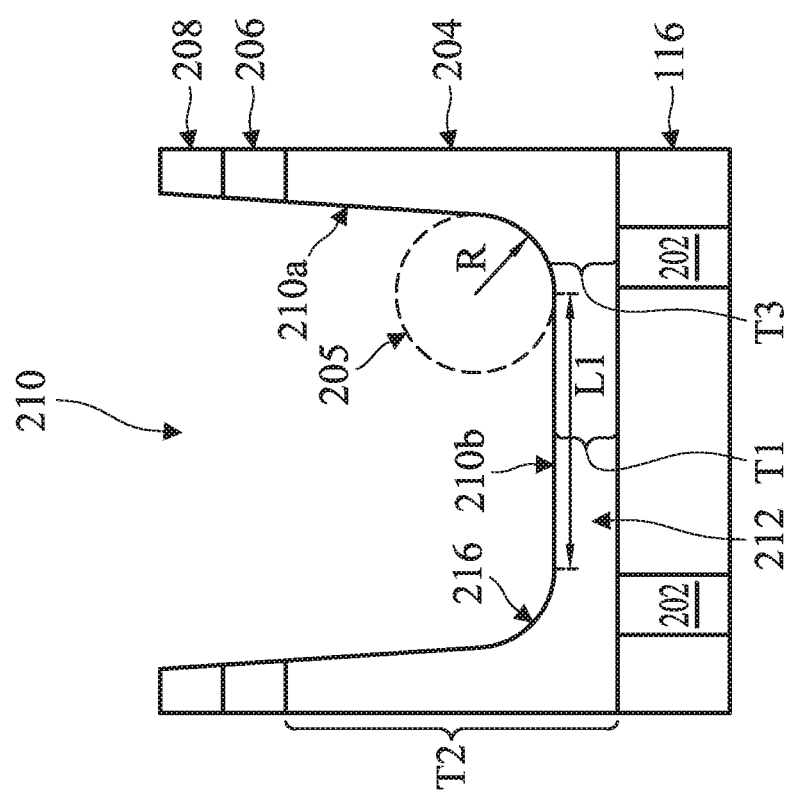

FIG. 6 shows the etching of pad layer 206 and second dielectric layer 204 using mask layer 208 as a patterning mask. The etching extends opening 210 through pad layer 206 and into second dielectric layer 204. In some embodiments, the etching is an anisotropic etching. In some embodiments, the etching may be performed according to the following parameters: high radio frequencies from about 100 W to about 500 W, low radio frequencies from about 0 W to about 50 W, pressure from about 20 mT to about 80 mT, temperature from about 40° C. to about 70° C., and voltage from about 0V to about 500V. The etching may include a dry etching process using, for example, $C_xF_y$ (i.e., a fluorocarbon such as tetrafluoromethane, octafluoropropane, or the like), $N_2$, $O_2$, Ar, or the like as a process gas. In some embodiments, $C_xF_y$ may be applied at a rate of about 20 standard cubic centimeters per minute (SCCM) to about 50 SCCM, $N_2$ may be applied at a rate of about 0 SCCM to about 100 SCCM, $O_2$ may be applied at a rate of about 0 SCCM to about 25 SCCM, and Ar may be applied at a rate of about 600 SCCM to about 1200 SCCM. The etching may continue for a preset period of time, wherein the preset period of time is determined according to the etching process being used, the material composition of second dielectric layer 204, and a desired amount of penetration of second dielectric layer 204 by opening 210.

As depicted in FIG. 6, the etching of second dielectric layer 204 does not penetrate through second dielectric layer 204. After the etching, a liner 212 of second dielectric layer 204 remains between opening 210 and first dielectric layer 116/vias 202. Liner 212 forms a barrier between a treatment that will be performed in opening 210 (see FIG. 7) and the underlying first dielectric layer 116/vias 202. For example, liner 212 may protect vias 202 during a subsequent treatment 214 (See FIG. 7). Liner 212 may have a thickness T1 at a center point of liner 212 of about 50 Å to about 200 Å, such as about 100 Å, Second dielectric layer 204 may comprise a thickness T2 of about 400 A to about 1500 Å, such as about 600 Å. A thickness T3 of liner 212 that is over vias 202 may be larger than the thickness T1 of the liner 212 at the center point of opening 210. Thickness T3 may be about 50 Å to about 300 Å, such as about 200 Å. A length L1 of a distance in which liner 212 has a substantially same thickness over the center point of liner 212 is about 30 Å to about 150 Å, such as about 100 Å.

As depicted in FIG. 6, the etching of second dielectric layer 204 may taper sidewalls 210a of opening 210 to have a slanted, non-perpendicular profile. For example, sidewalls 210a may have an angle of about 45° to about 80°, such as about 60° after etching. Additionally, a bottom surface 210b of opening 210 may have a rounded profile. For example, bottom corners 216 of opening 210 may be round in profile. Bottom corners 216 may form a circular arc with a radius of curvature R. If the circular arc with the radius of curvature R were extended past bottom corners 216 into a virtual full 360° circle, virtual circle 205 would be formed. In some embodiments, R is about 20 Å to about 100 Å, such as about 50 Å.

As will be discussed in detail below, opening 210 may form a trench in which a conductive line will be formed (see FIGS. 10-12). If the etching of second dielectric layer 204 depicted in FIG. 6 were continued to etch through second dielectric layer 204 until vias 202 were exposed, opening 210 would have a profile similar to the profile depicted in FIG. 6. In some embodiments, the tapered sidewalls 201a and rounded bottom surface 210b of opening 210 may prevent the etching process from fully exposing an underlying via 202, for example because the second dielectric layer 204 has a thickness T3 over via 202 that is larger than the thickness T1 of liner 212. As such, an electrical coupling of vias 202 to a conductive line 224 that will be formed in opening 210 (see FIGS. 10-12) may be less reliable, and yield rates may be decreased. Manufacturing processes of devices may be complicated. An improved profile with less tapered sidewalls 210a and a flatter bottom surface 210b may result in better contacts between vias 202 and a conductive line that will be formed in opening 210 (see FIGS. 10-12). An improved profile with less tapered sidewalls 210a and a flatter bottom surface 210b may help to improve reliability and increased yield rates. More predictable manufacturing may be achieved.

An improved opening profile may be obtained by decreasing the thickness T2 of the second dielectric layer 204. However, a reduction in second dielectric layer 204 may create undesirable electrical loading on the conductive line 224 that is formed in the opening (See FIGS. 10-12). An increase in electrical loading on a conductive line 224 can decrease reliability and decrease performance of packages.

Figure 10:
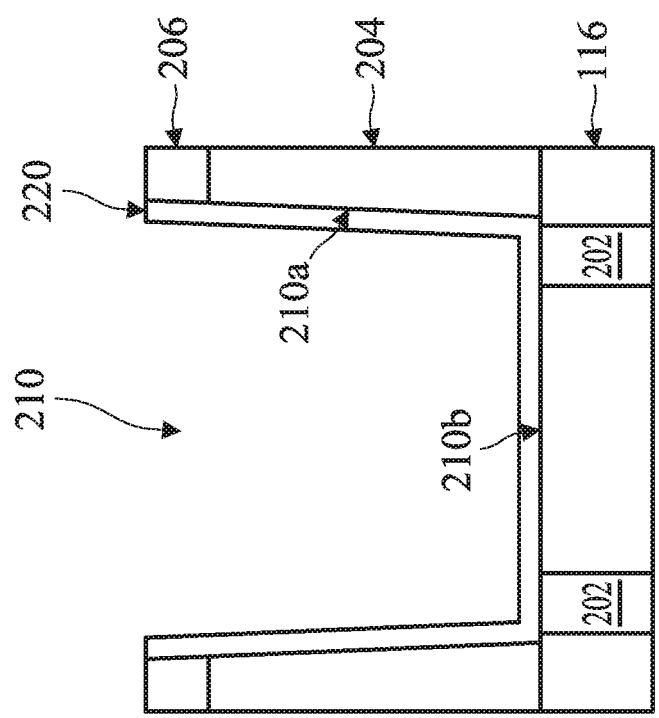
Figure 11:
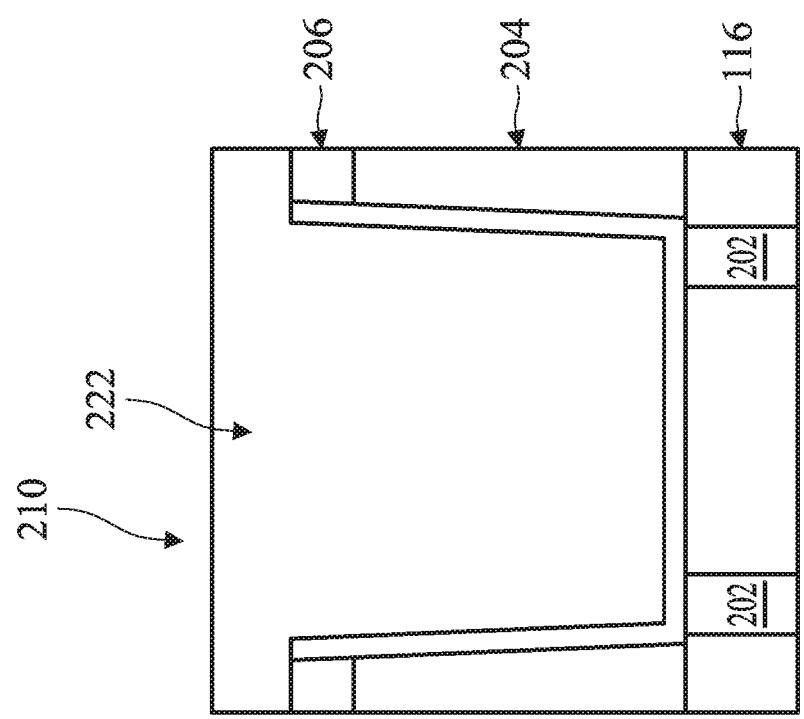

Referring to FIG. 7, a treatment 214 may be performed on second dielectric layer 204 adjacent to opening 210 to improve the opening profile before a conductive line 224 is formed in opening 210 (see FIGS. 10-12). During treatment 214, a gas may be applied to bottom surface 210b through opening 210. The atoms and/or molecules of the gas being applied during treatment 214 may physically bombard bottom surface 210b, causing a further etching of bottom surface 210b. Liner 212 prevents the gas from physically bombarding first dielectric layer 116 and vias 202 during treatment 214. In some embodiments, treatment 214 may continue until a particular profile is achieved. In some embodiments, treatment 214 may continue until liner 212 has a thickness T1 at a center point of bottom surface 210b of 20 Å or less.

In some embodiments, the gas being applied in treatment 214 is a gas with a large molecular mass. For example, gases with larger molecular masses may be more effective in etching bottom surface 210b through a physical bombardment than gases with smaller molecular masses due to increased momentum. In some embodiments, treatment 214 may use a noble gas that is applied to bottom surface 210b, such as helium (He), neon (Ne), argon (Ar), krypton (Kr), xenon (Xe) and/or radon (Rn). In some embodiments, the gas being applied during treatment 214 may be substantially pure. In some embodiments, the gas being applied during treatment 214 may be a mixture of different gases. In some embodiments, treatment 214 may include a single gas that is applied for the whole treatment 214. In some embodiments, different gases are applied at different time intervals during treatment 214.

In some embodiments, treatment 214 may use substantially pure argon that is applied at a rate of about 200 SCCM to about 1000 SCCM. Argon gas may be readily available for use in treatment 214.

In some embodiments, treatment 214 may help to create sidewalls 210a of opening 210 that are less tapered. Treatment 214 may help to create a bottom surface 210b of opening 210 that is flatter or flat. In some embodiments, treatment 214 may help to improve the profile of opening 210 without requiring a reduction in a depth of a trench.

Figure 8B:
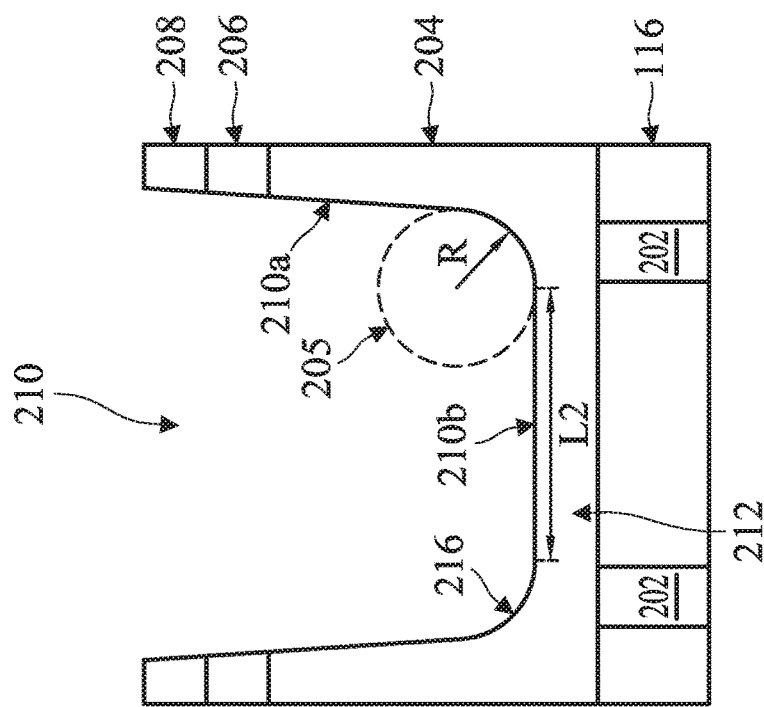
Figure 8A:
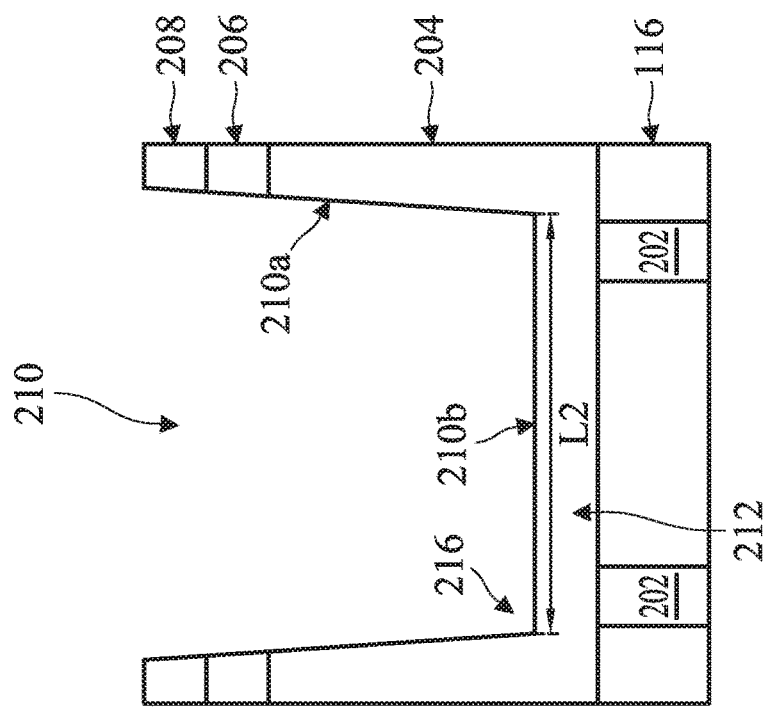

Referring to FIGS. 8A and 8B, after treatment 214 is performed the profile of opening 210 has been improved. Sidewalls 210a of opening 210 may be less tapered, and a bottom surface 210b is less rounded (FIG. 8B) or flat (FIG. 8A). Bottom corners 216 of opening 210 may be less rounded (FIG. 8B) or substantially square (FIG. 8A). Liner 212 may have a substantially uniform thickness at a center point of opening 210 and at sidewalls of opening 210. A length L2 along which liner 212 has a substantially same thickness over a center point of liner 212 has been increased, and is about 80 Å to about 200 Å, such as about 150 Å. If bottom corners 216 are not perpendicular and still rounded, such as the embodiment depicted in FIG. 8B, then a degree of curvature of the rounded edges has been increased and the bottom corners 216 are more perpendicular than they were before the treatment 214. For example, after the treatment 214, bottom corners 216 may form circular arcs with a radius of curvature R, where a length of R has decreased compared to R before treatment 214. If the circular arc with the radius of curvature R were extended past bottom corners 216 into a virtual full 360° circle, virtual circle 205 would be formed. In some embodiments, after treatment 214, R is about OA to about 20 Å, such as about 5 Å.

Figure 9:
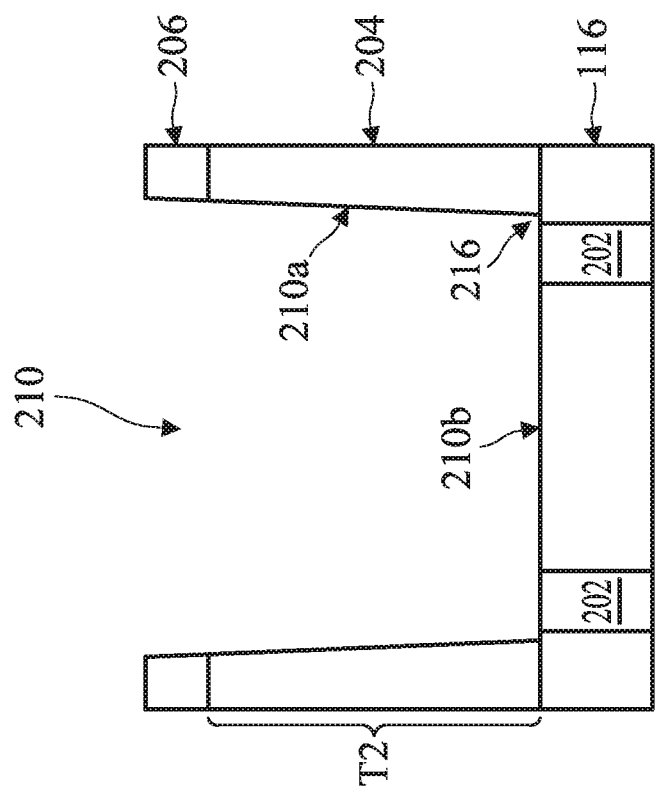

Next, referring to FIG. 9, a further etch is performed to remove liner 212 and expose vias 202. The etching of liner 212 may include any of the etching processes described above. For example, the etching may include a dry etching process using, for example, $C_xF_y$ (i.e., a fluorocarbon such as tetrafluoromethane, octafluoropropane, or the like), $N_2$, $O_2$, Ar, or the like as a process gas. A wet clean process may be performed to remove any remaining portions of mask layer 208. The resulting structure is depicted in FIG. 9.

As depicted in FIG. 9, opening 210 displays an improved profile as compared to the profile of FIG. 6. Sidewalls 210a of opening 210 may be less tapered. Bottom surface 210b of opening 210 may be less rounded or flat. Bottom corners 216 of opening 210 may be less rounded or square. Due to the less rounded or flat bottom surface 210b, the etching processes have been fully exposed vias 202 and second dielectric layer 204 does not extend over vias 202. Second dielectric layer 204 substantially maintains its original thickness T2 of about 400 Å to about 1000 Å, such as about 600 Å. As such, the improved profile of opening 210 may be achieved without a substantial decrease in a thickness of second dielectric layer 204 and corresponding increase in an electrical loading of a conductive feature that is formed in opening 210. The improved profile of opening 210 may lead to better electrical contacts between vias 202 and a conductive line 224 that is formed in opening 210 (see FIGS. 10-12), greater reliability, greater yields, and/or greater predictability of manufacturing processes for forming devices containing interconnects formed as described herein.

FIGS. 10 through 12 depict the formation of a conductive line 224 in opening 210. FIG. 10 illustrates the formation of a barrier layer 220 in opening 210. Barrier layer 220 may cover sidewalls 210a and a bottom surface 210b of opening 210. Barrier layer 220 may comprise, for example, titanium nitride, titanium oxide, tantalum nitride, tantalum oxide or the like. Barrier layer 220 may be deposited using any suitable deposition process, such as CVD, PVD, a conformal deposition process, or the like.

FIGS. 11 and 12 illustrate the filling of opening 210 to form conductive line 224 in second dielectric layer 204. First, as illustrated by FIG. 11, a metallic material 222 such as copper, a copper alloy, tungsten, aluminum, or another suitable conductor may be deposited into opening 210. The deposition of the metallic material 222 may overflow opening 210 and second dielectric layer 204. Subsequently, as illustrated by FIG. 12, a planarization (e.g., CMP or etch back) maybe used to remove overflow portions. The planarization may also remove any remaining portions of pad layer 206. As part of the planarization, top portions of barrier layer 220 may also be removed. Thus, conductive line 224 is formed in dielectric layer 102.

As shown in FIG. 12, conductive line 224 may have a profile that conforms to the profile of opening 210 (shown in FIG. 9). A bottom surface of conductive line 224 may be flat or less round than a conductive line formed in an opening having a profile depicted in FIG. 6, for example. An upper surface of conductive line 224 may be substantially planar with an upper surface of second dielectric layer 204. Conductive line 224 may have a thickness T4 of about 200 Å to about 800 Å, such as about 400 Å. In some embodiments, a thickness of conductive line 224 is about the same as a thickness of dielectric layer 204. Conductive line 224 and barrier layer 220 are physically and electrically coupled to vias 202, and second dielectric layer 204 does not extend over the vias 202.

In some embodiments, additional dielectric layers comprising vias and/or conductive lines may be formed over second dielectric layer 204 using the same or similar processes described above.

As described herein, an interconnect structure may be formed wherein conductive lines are formed in openings having an improved profile. In some embodiments, a treatment may be applied to an opening in a dielectric layer in which a conductive line will be formed. After the treatment, the opening may have less tapered sidewalls and a less rounded or flat bottom surface. The length of the opening along the bottom surface of the opening may be increased. A conductive line that is formed in an opening having an improved profile may have better contact with an underlying conductive features, and devices that include interconnects formed as described herein may have greater reliability, greater yields, and/or greater predictability of manufacturing processes for forming devices containing interconnects formed as described herein.

According to some embodiments, a method is provided. The method includes forming a first dielectric layer. The method also includes forming an opening in the first dielectric layer. The method also includes applying a gas to the first dielectric layer through the opening. After applying the gas to the first dielectric layer through the opening, a bottom surface of the opening has been planarized. The method also includes etching the first dielectric layer through the opening to expose a first contact underlying the first dielectric layer. The method also includes forming a conductive line in the opening.

According to some embodiments, a method is provided. The method includes forming a first dielectric layer. The method also includes forming a via in the first dielectric layer. The method also includes forming a second dielectric layer overlying the first dielectric layer. The method also includes forming a mask layer over the second dielectric layer. The method also includes etching the second dielectric layer through an opening in the mask layer to form a trench in the second dielectric layer. After the etching of the second dielectric layer, a section of the second dielectric layer forms a liner between a bottom surface of the trench and the first dielectric layer, the liner having a curved upper surface. The method also includes applying a gas to the second dielectric layer in the trench to reduce a degree of curvature of the curved upper surface of the liner. The method also includes etching the liner through the trench to expose the via. The method also includes forming a conductive line in the trench.

According to some embodiments, a method is provided. The method includes providing a substrate comprising a transistor. The method also includes forming a first dielectric layer over the substrate. The method also includes forming a conductive feature in the first dielectric layer, the conductive feature being electrically coupled to the transistor. The method also includes forming a second dielectric layer over the first dielectric layer. The method also includes forming an opening in the second dielectric layer. The method also includes treating the second dielectric layer in the opening with a noble gas, wherein after the treating of the second dielectric layer with the noble gas, a bottom surface of the opening has been leveled. The method also includes forming a conductive line in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming a first dielectric layer;
forming an opening in the first dielectric layer;

applying a gas to the first dielectric layer through the opening, wherein after applying the gas to the first dielectric layer through the opening, a bottom surface of the opening has been planarized;

etching the first dielectric layer through the opening to expose a first contact underlying the first dielectric layer, wherein, after the applying and before the etching, a bottom corner of the opening is beyond an outmost edge of the first contact; and forming a conductive line in the opening.

2. The method according to claim 1, wherein applying the gas to the first dielectric layer through the opening comprises applying argon gas to first dielectric layer through the opening.

3. The method according to claim 2, wherein the argon gas is substantially pure argon and no other process gases are present during the applying the gas to the first dielectric layer through the opening.

4. The method according to claim 1, further comprising etching the first dielectric layer to expose a second contact underlying the first dielectric layer, wherein the first contact and the second contact are disposed in a second dielectric layer.

5. The method according to claim 1, wherein during the applying the gas to the first dielectric layer through the opening, the first dielectric layer forms a liner that physically isolates the first contact from the gas.

6. The method according to claim 5, wherein, before applying the gas to the first dielectric layer through the opening, the liner has a first thickness underneath a sidewall of the opening, the first thickness being measured in a direction that is perpendicular to the bottom surface of the liner; and wherein, after applying the gas to the first dielectric layer through the opening, the liner has a second thickness underneath a sidewall of the opening, the second thickness being less than the first thickness, and the second thickness being measured in a direction that is parallel to the direction along which the first thickness is measured.

7. The method according to claim 1, wherein forming the opening in the first dielectric layer comprises:

forming an oxide layer over the first dielectric layer;

forming a metal hard mask layer over the oxide layer;

patterning the metal hard mask layer to expose an area of the oxide layer; and etching the oxide layer and the first dielectric layer through the metal hard mask layer to form the opening.

8. The method according to claim 7, wherein patterning the metal hard mask layer comprises partially etching the oxide layer, and wherein after the patterning of the metal hard mask layer the oxide layer comprises a rounded upper surface.

9. The method according to claim 1, wherein, before applying the gas to the first dielectric layer through the opening, the bottom surface of the opening and a sidewall of the opening form a first angle at the bottom corner of the opening, wherein after applying the gas to the first dielectric layer through the opening, the bottom surface of the opening and a sidewall of the opening form a second angle at the bottom corner of the opening, and wherein the second angle is closer to 90 degrees than the first angle.

10. The method according to claim 1, wherein applying the gas to the first dielectric layer through the opening comprises applying substantially pure argon gas to the first dielectric layer adjacent to the opening at a rate of about 200 SCCM to about 1000 SCCM.

11. A method, comprising:

forming a first dielectric layer;

forming a first via and a second via in the first dielectric layer;

forming a second dielectric layer overlying the first dielectric layer;

forming a mask layer over the second dielectric layer;

etching the second dielectric layer through an opening in the mask layer to form a trench in the second dielectric layer, wherein after the etching of the second dielectric layer, a section of the second dielectric layer forms a liner between a bottom surface of the trench and the first dielectric layer, the liner having a curved upper surface;

applying a gas to the second dielectric layer in the trench to reduce a degree of curvature of the curved upper surface of the liner, wherein after the applying the gas, a top edge of the liner is substantially flat, and the liner is longer than a distance from a first outmost interface between the first via and the first dielectric layer to a second outmost interface between the second via and the first dielectric layer;

etching the liner through the trench to expose the first via and the second via; and forming a conductive line in the trench.

12. The method according to claim 11, wherein the gas comprises substantially pure argon.

13. The method according to claim 11, wherein the liner physically isolates the first dielectric layer from the gas that is applied to the second dielectric layer in the opening.

14. The method according to claim 11, wherein the mask layer is a metal hard mask.

15. The method according to claim 11, wherein the first via is positioned near a first sidewall of the trench, and the second via is positioned near a second sidewall of the trench.

16. A method, comprising:

providing a substrate comprising a transistor;

forming a first dielectric layer over the substrate;

forming a conductive feature in the first dielectric layer, the conductive feature being electrically coupled to the transistor;

forming a second dielectric layer over the first dielectric layer;

forming an opening in the second dielectric layer, the opening having a first substantially flat bottom with a first length;

treating the second dielectric layer in the opening with a noble gas, the opening having a second substantially flat bottom with a second length larger than the first length after the treating of the second dielectric layer with the noble gas; and forming a conductive line in the opening.

17. The method according to claim 16, wherein the first dielectric layer is physically isolated from the opening during the treating of the second dielectric layer with the noble gas.

18. The method according to claim 16, further comprising after the treating of the second dielectric layer with the noble gas, etching the second dielectric layer to expose the conductive feature, wherein forming the conductive line comprises forming the conductive line so that it physically contacts the conductive feature.

19. The method according to claim 16, wherein forming the opening in the second dielectric layer comprises:

forming an oxide layer over the second dielectric layer;

forming a metal hard mask layer over the oxide layer;

patterning the metal hard mask layer to expose an area of the oxide layer; and etching the second dielectric layer through the metal hard mask layer and the oxide layer to form the opening.

20. The method according to claim 19, wherein treating the second dielectric layer in the opening with the noble gas comprises applying substantially pure argon gas to the first dielectric layer in the opening at a rate of about 200 SCCM to about 1000 SCCM.

* * * * *